United States Patent
Fang et al.

(10) Patent No.: US 8,897,910 B2
(45) Date of Patent: Nov. 25, 2014

(54) PARTICLE BEAM-ASSISTED ULTRA-PRECISION MACHINING METHOD FOR SINGLE-CRYSTAL BRITTLE MATERIALS

(75) Inventors: Fengzhou Fang, Tianjin (CN); Yunhui Chen, Tianjin (CN); Zongwei Xu, Tianjin (CN); Zhongjun Qiu, Tianjin (CN); Xiaodong Zhang, Tianjin (CN); Tengfei Dai, Tianjin (CN); Xiaotang Hu, Tianjin (CN)

(73) Assignee: Tianjin University, Tianjin (CN)

( * ) Notice: Subject to any disclaimer, the term of this patent is extended or adjusted under 35 U.S.C. 154(b) by 744 days.

(21) Appl. No.: 13/159,811

(22) Filed: Jun. 14, 2011

(65) Prior Publication Data

US 2012/0012563 A1  Jan. 19, 2012

Related U.S. Application Data

(63) Continuation-in-part of application No. PCT/CN2010/072522, filed on May 7, 2010.

(30) Foreign Application Priority Data

May 25, 2009 (CN) .......................... 2009 1 0069010

(51) Int. Cl.
*G06F 19/00* (2011.01)
*B24B 1/00* (2006.01)
(Continued)

(52) U.S. Cl.
CPC .................. *B28D 5/00* (2013.01); *C30B 29/06* (2013.01); *C30B 29/08* (2013.01);
(Continued)

(58) Field of Classification Search
CPC ...................... H01L 21/76254; H01L 27/1266; H01L 29/66772; H01L 21/02532; H01L 21/02686; H01L 21/2007; H01L 21/32115; H01L 21/78; B23K 2201/40; B23K 26/263; B23K 26/4075; B06B 1/0622; B24B 13/00; B24B 1/00; B24B 7/228; B24B 7/241; H01J 37/30; Y01S 148/046
USPC .......... 700/117, 159, 160; 438/22, 33, 48, 57, 438/68, 106, 110, 113, 114; 451/28, 41; 204/192.32–192.35, 192.32–192.357; 219/50, 121.11, 121.12, 121.18, 219/121.19, 121.2, 121.6, 121.61, 219/121.67–121.69; 250/492.1–492.3
See application file for complete search history.

(56) References Cited

U.S. PATENT DOCUMENTS 5,086,015 A * 2/1992 Itoh et al. ................. 204/192.34
5,573,447 A * 11/1996 Kozakai et al. ................. 451/41
(Continued)

FOREIGN PATENT DOCUMENTS

CN   101559627 A * 10/2009
CN   102476405 A *  5/2012
(Continued)

*Primary Examiner* — Crystal J Barnes-Bullock
(74) *Attorney, Agent, or Firm* — George G. Wang; Bei & Ocean

(57) ABSTRACT

The invention relates to a new technology which uses a surface modification method for ultra-precision machining, and in particular relates to a particle beam-assisted ultraprecision machining method for single-crystal brittle materials. The invention, the particle beam-assisted ultra-precision machining method for single-crystal brittle materials, can significantly improve machining accuracy, reduce surface finish and greatly reduce tool wear during ultra-precision machining of brittle materials. The method adopts the technical proposal that the method comprises of the following steps: a) utilizing simulation software to simulate modification parameters according to cutting depth, surface roughness and other machining requirements; b) using particle beams to bombard or irradiate the surface of a single-crystal brittle material to be machined, according to the energy and fluence obtained from the simulation results; c) utilizing ultra-precision cutting (or grinding) technology to perform ultra precise cutting on the single-crystal material which is bombarded or irradiated by the particle beams; and d) measuring and characterizing the surface quality of the machined material and comparing the improvement of the machined surface quality with that of the unmodified machined surface. The method is mainly used for machining the single-crystal brittle materials.

4 Claims, 2 Drawing Sheets

(51) Int. Cl.
*C23C 14/00* (2006.01)
*B23K 15/00* (2006.01)
*B23K 26/00* (2014.01)
*G21K 5/10* (2006.01)
*H01J 37/08* (2006.01)
*A61N 5/00* (2006.01)
*G21G 5/00* (2006.01)
*B28D 5/00* (2006.01)
*C30B 29/06* (2006.01)
*C30B 29/08* (2006.01)
*C30B 33/04* (2006.01)

(52) U.S. Cl.
CPC ..................................... *C30B 33/04* (2013.01)
USPC ... 700/160; 451/41; 204/192.34; 204/192.37; 219/121.2; 219/121.61; 219/121.69; 250/492.21; 250/492.3

(56) References Cited

U.S. PATENT DOCUMENTS

| | | | |
|---|---|---|---|
| 7,173,212 B1 * | 2/2007 | Semak | 219/121.69 |
| 7,901,967 B2 * | 3/2011 | Komura et al. | 438/33 |
| 8,021,958 B2 * | 9/2011 | Yamazaki et al. | 438/455 |
| 8,624,185 B2 * | 1/2014 | Maas et al. | 250/309 |
| 2009/0069689 A1 * | 3/2009 | Isono | 600/459 |
| 2009/0115028 A1 * | 5/2009 | Shimomura et al. | 257/623 |
| 2009/0117692 A1 * | 5/2009 | Koyama et al. | 438/164 |
| 2011/0132169 A1 * | 6/2011 | Kapoor et al. | 83/875 |

FOREIGN PATENT DOCUMENTS

EP 2298521 A1 * 3/2011
WO WO 2010135949 A1 * 12/2010

* cited by examiner

PARTICLE BEAM-ASSISTED ULTRA-PRECISION MACHINING METHOD FOR SINGLE-CRYSTAL BRITTLE MATERIALS

CROSS-REFERENCE TO RELATED APPLICATION

This application is a continuation-in-part application of PCT Application No. PCT/CN2010/072522, which was filed in China Receiving Office on May 7, 2010 and claimed benefit from Chinese Patent Application No. 200910069010.X, filed on May 25, 2009.

FILED OF THE INVENTION

The invention relates to a new technology which uses a surface modification method for ultra-precision machining, and in particular, relates to a particle beam-assisted ultraprecision machining method for single-crystal brittle materials.

BACKGROUND OF THE INVENTION

Ultra-precision machining is a high precision machining technology developed to adapt to the growing requirement for high accuracy in surface finishing. Ultra-precision machining includes ultra-precision turning, grinding, lapping, polishing, etc. As single-crystal brittle materials, such as single-crystal silicon, are hard and brittle, machined surfaces will show brittle fractures during ultra-precision machining processes, which significantly affect surface quality and form accuracy.

Reducing and even eliminating embrittlement in the machining process, improving the machining accuracy and reducing surface roughness during ultra-precision machining have always been the goals in this field of research.

SUMMARY OF THE INVENTION

In order to overcome the deficiency in the prior art, the present invention provides an ultra-precision machining method based on the bombardment of particle beams on the target material for surface modification, which significantly improves the machining accuracy, reduces the surface roughness of the ultra-precision machined surface of brittle materials and greatly reduces tool wear. The technical solution of the invention comprises the following steps:

a) utilizing simulation software to simulate ion implantation parameters according to the cutting depth, the surface roughness, and other machining requirements;

b) using particle beams to bombard or irradiate the surface of the single-crystal brittle material for machining, with such amount of energy and fluence as determined from the simulation results in step 1;

c) utilizing ultra-precision cutting (or grinding) technology to perform ultra-precision machining on the single-crystal material which has been bombarded by particle beams;

d) measuring and characterizing the surface quality of the machined surface, and comparing the improvement of the machined surface quality with the unmodified surface.

In the particle beam-assisted ultra-precision machining method according to the present invention, the software used for simulation is SRIM and the method utilizes the following specifics:

The particle beams can be proton beams or Helium ion beams or F ion beams. Other beams, such as Si ion beam or Cl ion beam, may also be used to archive satisfactory results.

The cutting depth of the machining process is less than the bombardment or irradiation depth by particle beams.

The single-crystal brittle materials can be single-crystal silicon or single-crystal germanium, or materials with a single crystal structure, the single-crystal brittle materials used in practicing the present invention are off-shelf products which a person of ordinary skill in the art can purchase suitable ones in the open market.

Utilizing ultra-precision cutting technology refers to cutting with single-crystal diamond tools for producing the mirror surface or asperic surface.

Compared to the prior art, the present invention has the following advantageous effects:

Firstly, the invention uses a certain fluence of particle beams to bombard (or irradiate) the to-be-machined surface for a certain time, and the structure of to-be machined surface layer changes under the bombardment of the particle beams. The object of improving the machining accuracy and reducing the ultra-precision machined surface roughness and tool wear is achieved by improving the plasticity performance of material surface, which effectively reduces the embrittlement in the process of machining. The method of this invention is flexible and convenient, fundamentally reducing the effect of surface embrittlement on the machined surface roughness, improving the surface quality, and reducing tool wear from machining mechanisms.

Secondly, the method of this invention is flexible and convenient. The fluence and time of bombarding (irradiating) particle beams can be selected according to the machining depth and the materials to be machined.

DETAILED DESCRIPTION OF PARTICULAR EMBODIMENTS OF THE INVENTION

Figure 1:
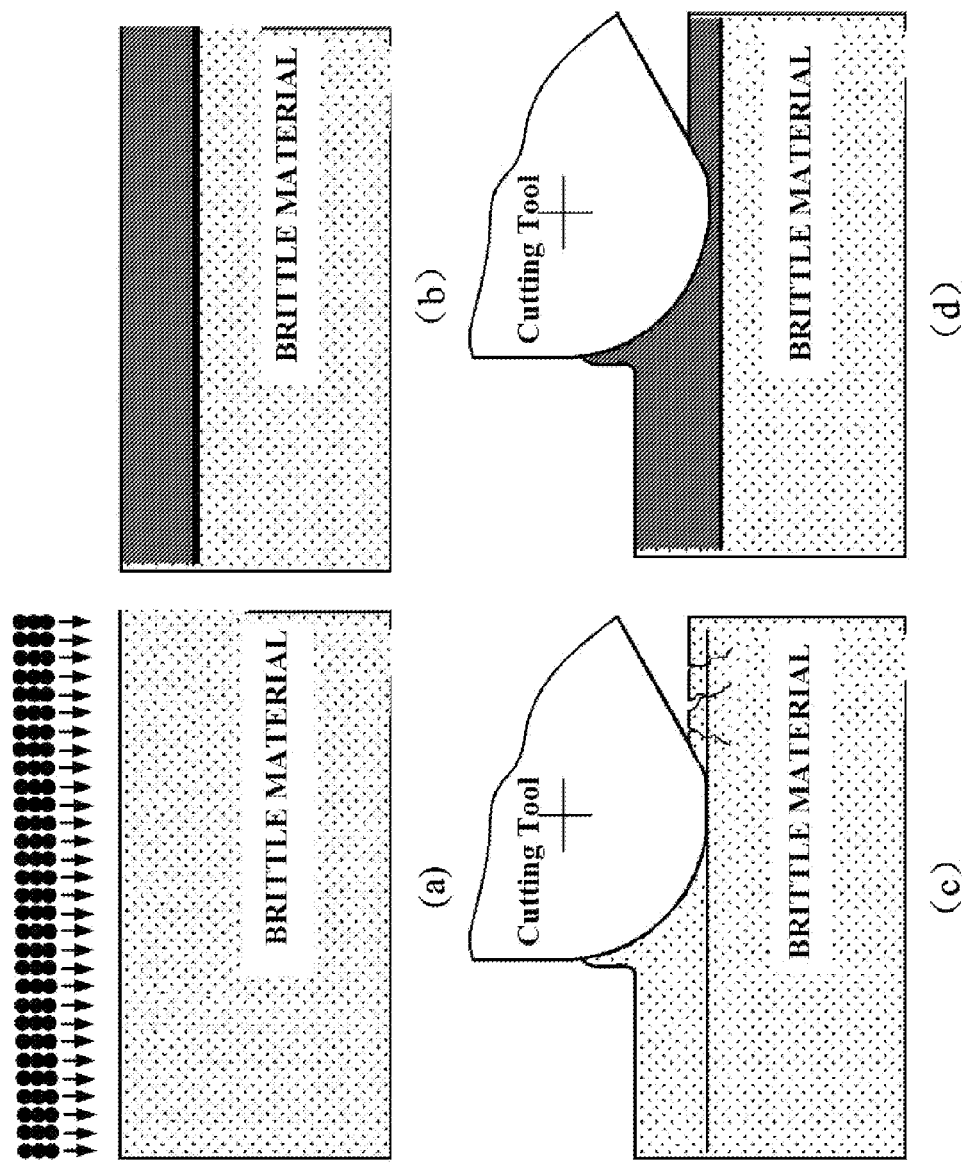
FIG. 1 shows proton ($H^+$) beams bombarding (or irradiating) the brittle material: (a) the brittle material without being bombarded (or irradiated) by proton beams; (b) the brittle material bombarded (or irradiated) by proton beams; (c) the brittle material without proton beam bombardment (or irradiation) showing fractures formed in machining process; (d) the brittle material bombarded (or irradiated) by proton beams showing no fractures in machining process.
Figure 2:
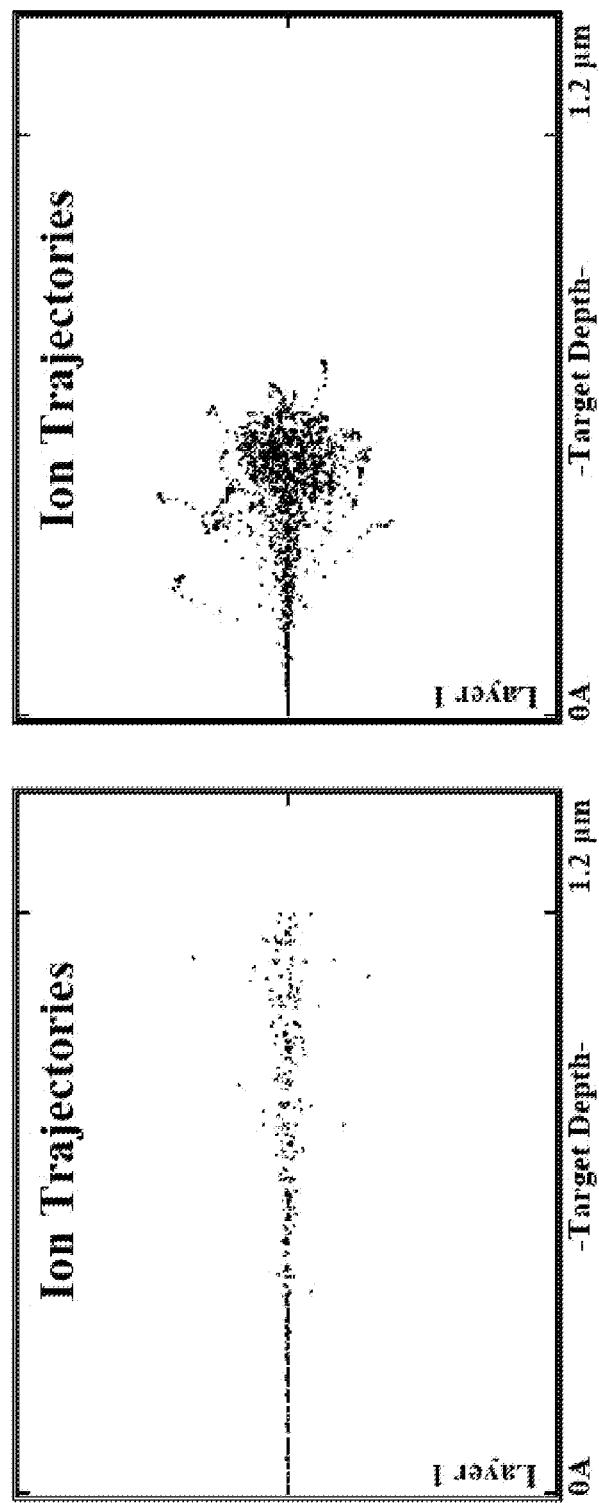
FIG. 2 shows the SRIM simulation of proton beams bombardment (or irradiation), where proton is used to bombard silicon substrate using same fluence and the structural damage and proton bombardment depth and other parameters are controllable from the result of simulation. (a) accelerating voltage 200 KeV, (b) accelerating voltage 50 KeV.

Machining single-crystal brittle material, such as single-crystal silicon: Firstly, the optimized parameters are obtained by theoretical research and simulation analysis on the various parameters of particle beam bombardment (the fluence of beams, the applied voltage value, and the bombardment or irradiation time). Theoretically predicted parameters are entered into the SRIM software, including voltage, fluence, ion type used and the characters of the substrate. SRIM is a free and publicly available software, for quantum mechanical treatment of ion-atom collision. SRIM will calculate the ion bombardment results of the substrate according to the parameters in the form of graph of damage distribution. Theoretically predicting the parameters and using of the SRIM software are within ordinary skill of the art.

Secondly, the sample is placed in the particle beam generator and the surface to be machined is bombarded (irradiated) by particle beams. Based on the above software simulation, the bombardment (irradiation) are conducted with a certain fluence and for a certain duration of time predetermined according to machining requirements, cutting depth, surface quality, form accuracy.

By the action of the particle beams, the single-crystal structure of the workpiece surface transforms from single-crystal to poly-crystal, or even to an amorphous phase. The condition of the bombarded surface can be examined by scanning electron microscope for implantation or bombardment depth. And the crystal structure changes can be observed by transmission electron microscope. The plasticity of the surface layer is improved and the embrittlement in the machining process is significantly reduced, The surface quality and the brittleness changes can be examined by nano-indentation for observing the crack propagation of the indentation and the force curves of indenter inserting on the substrate surface. thus achieving the purpose of improving the machining accuracy and reducing the roughness of the ultra-precision machined surface.

The structural transformation from single-crystal to poly-crystal, or even to an amorphous phase reduces the brittleness of material, and also reduces the tool wear in the machining process. The surface roughness of machined surface can be judged by Atomic Force Microscope scanning the surface. The tool wear can be judged by scanning electron microscope observing the wear condition of the tool edge.

The invention is described in detail below with drawings and specific embodiments.

The invention provides a method in which particle beam-assisted ultra-precision machining produces an ultra-smooth mirror surface or aspheric lens, comprising the following steps:

(1) utilizing simulation software to simulate machining parameters according to the machining requirements (cutting depth, surface quality, form accuracy);

(2) using particle beams according to the fluence obtained by simulated results to bombard or irradiate the surface of the single-crystal brittle material to be machined;

(3) using single-crystal diamond tools to cut the single-crystal material which is bombarded by the particle beams;

(4) measuring and characterizing the machined surface quality, etc.

For said particle beam-assisted ultra-precision machining method of bombarding (irradiating) the surface of workpiece to assist machining for obtaining an ultra-smooth surface, wherein the software used in step (1) is SRIM or the likes with the similar simulation function;

In step (2), particle beams are used, the fluence of which and the bombardment (irradiating) time are controllable. In addition to proton beams, other particle beams (such as He ion, F ion, Cl ion and Si ion and so on) may also be used in practicing the present invention.

In step (3), the cutting depth is less than the depth of bombardment or irradiation by the particle beams.

The material to be machined is single-crystal brittle material, such as single-crystal silicon, single-crystal germanium, etc.

In this example, a single-crystal brittle material is single-crystal silicon with surface orientation, which is off-shelf products available to a person of ordinary skill in the art in the open market.

(1) utilizing SRIM simulation software to simulate bombardment (irradiation) parameters according to the machining requirements (cutting depth, surface roughness, form accuracy). In this example, the aim is to machine a freeform sinusoidal mirror. Surface roughness should be less than 10 nm, form accuracy should be less than 2 um. According to the machining requirements, the cutting depth for modified silicon surface should be less than 3 um. SRIM simulation software to utilized to simulate bombardment (irradiation) parameters according to this requirement. F ion is predefined as the bombardment ion according to previous experiences. Ion fluence and voltage is tested on SRIM for most adequete parameters. The simulation results: the bombardment fluence of F ion beams:$10^{14}$ ion/cm$^2$, applied voltage value: 10 MeV. the simulation results: the bombardment fluence of proton beams: $10^{16}$ ion/cm$^2$, applied voltage value: 2 MeV. Information about the SRIM software can be found at "www-srim-org" (please replace each dash with a dot to form a valid Internet address).

(2) using F ion beams to bombard or irradiate the to-be-machined surface, applying a fluence of $10^{14}$ ion/cm2, and voltage of 14 MeV according to the simulated result; After bombardment (irradiation), the lattice structure of the surface layer of the single crystal silicon has been transformed due to the ion bombardment. The cross-sectional transformed layer can be observed by scanning electron microscope, and measured to be in a depth of 4.5 μm, which accord with the machining requirement. Cross-sectional transmission electron microscopy (TEM) samples of the implantation layer were prepared using Nova 200 FIB-SEM dual-beam system equipped with an in situ Kleindiek rotational nanomotor. Using TEM observation of the sample, single-crystal silicon has been transformed to polycrystal even amorphous.

(3) using single-crystal diamond tools to cut the F ion beam-bombarded (irradiated) single-crystal silicon, machining follow the programmed cutting path for creating a sinusoidal mirror, wherein the cutting depth is 3 μm or below, the feed rate is 0.5 mm/min or lower, the cutting speed is 50 m/min or higher, and the single-crystal silicon can also be replaced by single-crystal germanium.

(4) measuring the surface roughness (Ra) of ultra-precision machined F ion beammodified single-crystal silicon, using Atomic Force Microscope surface scanning the result is less than 10 nm in Ra. Measuring the form-accuracy of ultra-precision machined F ion beam-modified single-crystal silicon using Taylor Hobson Form Talysurf PGI 2540, the result is less than 1 μm.

The above implementation steps are only to describe the technical theory and features of this invention and to make the technology of the invention easier to be understood and carried out. However, the protection scope of the invention is not limited to above embodiments; that is all methods which make some changes or modifications according to the essence of this invention belong to the protection scope of this invention.

What is claimed is:

1. A method of particle beam-assisted ultra-precision machining of single-crystal brittle material, comprising the following steps:
  a) utilizing simulation software to simulate modification parameters according to the cutting depth, the surface roughness, and other machining requirements;
  b) using particle beams to bombard or irradiate the surface of a single-crystal brittle material to be machined, according to the energy and fluence obtained from simulated modification parameters in step a);
  c) utilizing ultra-precision cutting or grinding technology to perform ultraprecision cutting with a diamond tool on the single-crystal material which is bombarded by the particle beams in step b);
wherein cutting depth of the machining process of step c) is less than bombarding or irritating depth of step b).

2. The method for particle beam-assisted ultra-precision machining of single-crystal brittle material of claim 1, wherein the simulation software for simulation is SRIM with a simulation function.

3. The method for particle beam-assisted ultra-precision machining of single-crystal brittle material of claim 1, wherein the particle beams are proton beams or Helium ion beams or F ion beams.

4. The method for particle beam-assisted ultra-precision machining of single-crystal brittle material of claim 1, wherein the single-crystal brittle material is single-crystal silicon or single-crystal germanium.

* * * * *